United States Patent [19]

Konno et al.

[11] Patent Number: 4,897,766
[45] Date of Patent: Jan. 30, 1990

[54] COMPOSITE TYPE CIRCUIT PARTS

[75] Inventors: Tadashige Konno; Makoto Saitoh, both of Tokyo, Japan

[73] Assignee: TDK Corporation, Tokyo, Japan

[21] Appl. No.: 192,985

[22] Filed: May 12, 1988

[30] Foreign Application Priority Data

| May 14, 1987 | [JP] | Japan | 62-117536 |
| May 14, 1987 | [JP] | Japan | 62-117539 |
| May 14, 1987 | [JP] | Japan | 62-117537 |
| May 14, 1987 | [JP] | Japan | 62-117538 |

[51] Int. Cl.$^4$ ........................................... H01F 15/10
[52] U.S. Cl. ..................... 361/421; 361/309; 361/405; 361/419; 336/192
[58] Field of Search ................. 357/70; 336/192; 361/303, 306, 309, 392, 400, 405, 417, 419, 420, 421

[56] References Cited

U.S. PATENT DOCUMENTS

| 3,691,425 | 9/1972 | Weyrich | 336/192 |
| 4,105,985 | 8/1978 | Plunkett | 336/192 |
| 4,158,745 | 6/1979 | Keller | 361/421 |
| 4,467,399 | 8/1984 | Van Husen | 361/419 |

Primary Examiner—Gerald P. Tolin
Attorney, Agent, or Firm—Armstrong, Nikaido Marmelstein Kubovcik & Murray

[57] ABSTRACT

This invention discloses a composite type circuit part comprising a conductive plate formed at both wings with inductor place portions, respectively, a pair of first intermediate coupling elements in which an inductor place portion is formed at one end opposed to each inductor place portion of the wings, and a second intermediate coupling element with one end arranged opposedly of a central portion of the conductive plate and arranged at a position between the pair of first intermediate coupling elements. A lead wire coupling portions for holding a lead wire, is provided in the first intermediate coupling element and the second intermediate coupling element. Lead wires are coupled to the lead wire coupling portions, respectively. Inductors are placed on the opposed inductor plate portions, respectively. A chip condenser is placed over and between the central portion of the conductive plate and the second intermediate coupling element, thereby providing a positive coupling state of the lead wires. The central portion of the conductive plate is projected to enhance the mechanical strength. Further, upright elements are provided on the intermediate coupling element to enhance the mechanical strength. Moreover, holes for preventing a flow of solder are provided partially in the conductive plate.

5 Claims, 10 Drawing Sheets

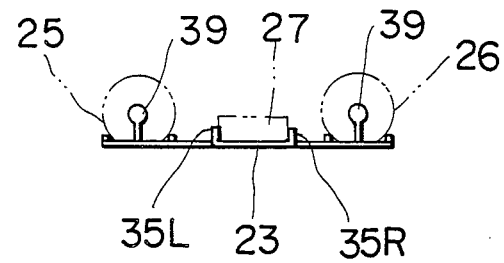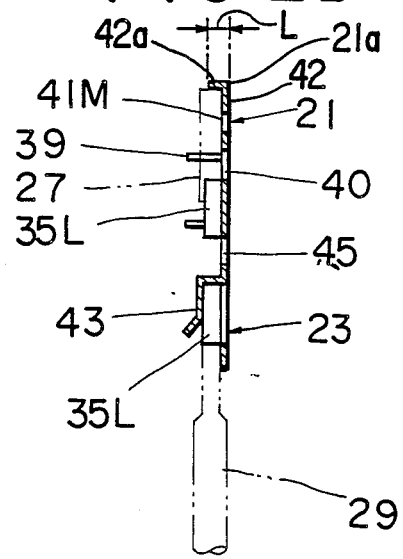

50  51

20

COMPOSITE TYPE CIRCUIT PARTS

BACKGROUND OF THE INVENTION

The present invention relates to a composite type circuit part having condensers, inductors and the like used for a television, VTR or the like.

For example, a conventional composite type circuit part composed of condensers, inductors and the like is shown in FIG. 7A and 7B.

In a composite type circuit part 1 shown therein, one end of inductors 5, 5 whose windings are wound around drum type cores, respectively, are placed and connected to both sides of a downwardly directed E-letter conductive plate 6 and one end of a chip condenser 8 is placed and connected to the central portion thereof; other ends of the inductors 5, 5 and other end of the chip condenser 8 are placed on and conductively connected to one end of coupling elements 7L, 7R, 7M, respectively; and lead wires 3a, 3b and 3c are placed on and conductively connected to other ends of the coupling elements 7L, 7R and 7M. In the figures, reference numeral 15 denotes a mold material for covering connection ends of the lead wires.

The mold material 15 is formed by the process of dip mold as shown in FIG. 7C.

More specifically, one end of each of the lead wires 3a to 3c is secured to a carrying web 17, a portion to be molded is put downwardly and a vessel 16 filled with the mold material 15 is prepared thereunder. Then, the carrying web 17 is moved downwardly and the portion to be molded is dipped into the mold material 15 within the vessel 16, after which it is pulled up.

As described above, in such a composite type circuit part, an upper portion shown of the conductive plate 6 is pressed in a direction as indicated by arrow A by means of a pusher 2 provided on an automatic inserting machine (not shown), and each of lead wires 3a, 3b and 3c is inserted and connected to other circuit substrate. This pusher 2 is composed of a metal cylindrical case 2a and a rubber material 2b, for example, filled therein.

However, in the composite type circuit part constructed as described above, the lead wires 3a to 3c connected to the coupling elements 7L, 7M and 7R are connected and secured by solder shown at 9a to 9c and mainly through the end surfaces of the respective lead wires, and therefore the mechanical strength of the connected portions is low. Accordingly, for example, in the case where they are placed on the other circuit substrate (not shown), the force to be applied when placed is concentrated on the connected portion between the intermediate coupling element and the lead wire connected thereto with the result that breakage is likely to occur. In addition, in the case where after being placed on the other circuit substrate, the lead wires and the other circuit substrate are placed in conduction and connected by solder, solders 9a to 9c for connecting the lead wires and the intermediate coupling element becomes molten due to the heat thereof, posing a problem in that inferior conduction not only occurs but shipment of products is impossible as the case may be.

In addition, in the composite type circuit part as constructed above, the central portion of the flatly formed conductive plate 6 is pressed by the pusher 2, and the lead wires 3a to 3c are inserted into the other circuit substrate by the pressing force. Therefore, the lower end 2c shown of the metal cylindrical case 2a comes into contact with the surface of the mold 15, which portion serves as a pressing portion. Accordingly, the pressing force of the pusher 2 causes a flexure to occur in the conductive plate 6. This produces a peeling in the connected portion of the condenser placed in conductive connection. For this reason, the surface of the mold material 15 is damaged by the cylindrical case 2a of the pusher 2, or the surface cracks, peels or the like which is unfavorable in quality. Furthermore, inferior electrical connection or breakage results due to the peeling of the condenser caused by the flexure of the conductive plate.

Moreover, in the mold process as shown in FIG. 7C, it is difficult to retain a mold material between an inductor 5 and a chip condenser 8 shown on left side of FIG. 7C and between an inductor 5 and a chip condenser 8 on the right side in FIG. 7C. That is, in the pulling up in the aforementioned dip mold process, the mold material hangs downwardly, which possibly results in the state where no mold material is present as shown at 9L and 9R shown. It is therefore considered that a clearance is narrowed to retain the mold material but an electric problem occurs due to being close to each other. For this reason, in the aforesaid structure, the required strength cannot be retained and in addition, for example, where they are placed on another substrate, stress is concentrated on the connected portion between the conductive plate 6 and the inductor and chip condenser, as a consequence of which a breakage will likely occur.

Furthermore, generally the chip condenser 8 mounted over the aforesaid conductive plate 6 and coupling element 7M is placed in conduction and connected through a flowing cream solder, and therefore, a slippage occurs when mounted, resulting in a displacement as indicated by the dash-dotted contour lines, posing a problem that connection becomes formed in the displaced condition. This is because of the fact that the coating area spreads to portions other than a portion where a chip condenser is mounted due to the difference in viscosity of cream solder to be coated, and the chip condenser is displaced in the coating area of the spread cream solder. Accordingly, when this state is left, the insertion of the chip condenser by the automatic inserting machine becomes impossible and in addition, there occurs the state wherein the chip condenser is not connected with the conductive plate and connecting element.

SUMMARY OF THE INVENTION

It is a first object of the present invention to make a positive coupling state between the lead wire coupling portions to increase the mechanical strength thereof.

It is a second object of the present invention to prevent a breakage of parts or peeling of a mold member when the apparatus is mounted on a substrate.

It is a third object of the present invention to prevent an incomplete adhesion of a mold member between lead wire coupling elements to increase the mechanical strengh of the apparatus.

It is a fourth object of the present invention to make a positive soldering of chip parts to prevent a displacement or inferior connection during mounting.

The structures of the present invention for achieving the aforementioned objects are as follows:

According to a first structure, there is provided a composite type circuit part comprising a conductive plate formed at both wings with inductor place portions, respectively, a pair of first intermediate coupling elements in which an inductor place portion is formed at one end opposed to each inductor place portion, and a second intermediate coupling element with one end arranged opposedly of a central portion of the conductive plate and arranged at a position between the pair of first intermediate coupling elements. A lead wire coupling portion, for holding a lead wire, is provided in the first intermediate coupling element and a second intermediate coupling element. Lead wires coupled to the lead wire are coupling portions, respectively. Inductors are placed on the opposed inductor place portions, respectively, and a chip condenser placed over and between the central portion of the conductive plate and the second intermediate coupling element.

According to a second structure, there is provided a composite type circuit part wherein the central portion of the conductive plate in the first structure is projected, and an upright portion is provided at the extreme end thereof.

According to a third structure, there is provided a composite type circuit portion wherein upright elements are provided on adjacent opposed ends, respectively, between the first intermediate coupling element and the second intermediate coupling element.

According to a fourth structure, there is provided a composite type circuit part wherein holes are partially provided in the central portion of the conductive plate in the first structure and the intermediate coupling element arranged opposedly thereto.

BRIEF DESCRIPTION OF THE DRAWINGS

FIGS. 2B, 2C and 2D are respectively sectional views taken on line B—B', C—C' and E—E' of FIG. 2A;

DESCRIPTION OF THE PREFERRED EMBODIMENTS

Figure 1:
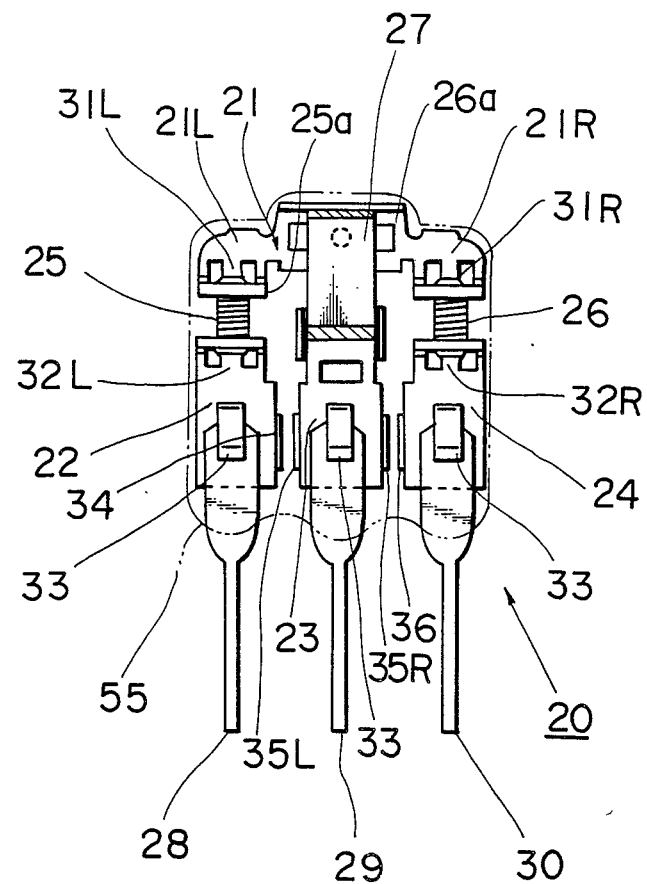
FIG. 1 is a plan view showing one embodiment of the present invention.

FIG. 1 is a plan view of a composite type circuit part.

In FIG. 1, a composite type circuit part 20 comprises a conductive plate 21 formed at both wing portions 21L and 21R with inductor place portions 31L and 31R, respectively. The inductor place portions 31L and 31R are formed at opposed ends with inductor place portions 32L and 32R, respectively, in a spaced apart relation. A pair of first intermediate coupling elements 22 and 24 are formed at the other end with a lead wire coupling, portion 33. A second intermediate coupling element 23 is formed with one end arranged oppositely of the central portion of the conductive plate 21 and is formed at the other end with a lead wire coupling portion 33, wherein upright elements 34 to 36 are respectively formed on adjacent opposed ends of the first intermediate coupling elements 22 and 24 and the second intermediate coupling element 23. Inductors 25 and 26 whose windings are wound around drum-shaped cores, respectively, are placed between the opposed inductor place portions 31L, 32L and 31R, 32R. A chip condenser 27 is placed over and between the central portion of the conductive plate 21 and one end of the second intermediate coupling element 23. Lead wires 28 to 30 are connected to lead wire coupling portions 33 of the first and second intermediate coupling elements. In FIG. 1, reference numeral 55 designates a mold material for covering the entirety including a connected end portion of a lead wire.

Figure 2A:
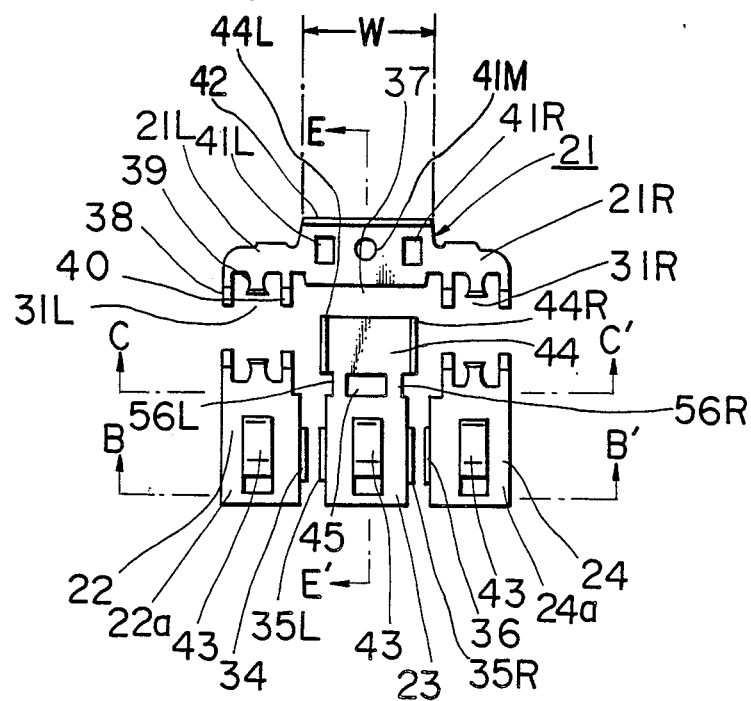
FIG. 2A is a plan view showing the relationship between a conductive plate used in the embodiment and an intermediate coupling element.
Figure 2B:
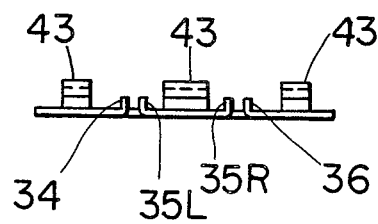

FIG. 2a is an explanatory view in which a chip condenser 27, inductors 25 and 26, a mold material 55 and lead wires 28 to 30 are omitted from the composite circuit part 20 shown in FIG. 1, and FIGS. 2B to 2D are an end view taken on B—B', an end view taken on C—C' and a sectional view taken on E—E', respectively.

In FIG. 2A, both wing portions 21L and 21R of the conductive plate 21 are formed at the same side end 37 with inductor place portions 31L and 31R in the form of an approximately downwardly directed "E"-letter.

Flanges 25a and 26a of the drum-shaped cores (inductors) 25 and 26 are placed on the inductor place portions 31L and 31R. The flanges 25a and 26a themselves are supported by bending, among three projected elements 38 to 40 constituting the inductor place portion. The projected element 39 is positioned in the center at a right angle to the paper surface, and uses the remaining projected elements 38 and 40. The projected element 39 bended approximately at right angle comes into contact with the end of the drum-shaped core placed and thereafter is placed in conduction and connected by solder or the like. It is to be noted that in the present embodiment, the inductor place portion formed in the first intermediate coupling elements 22 and 24 is likewise constructed.

The aforesaid conductive plate 21 is formed in the central portion thereof with three holes 41L, 41M and 41R. The conductive plate 21 is formed symmetrically left and right with the hole 41M being the center as shown, and the holes 41L and 41R in the square shape are formed at positions at equal intervals left and right from the circular hole 41M. The aforesaid chip condenser 27 is to be placed between these holes 41L and 41R. The holes 41L and 41R prevent creamy solder from being diffused in the lateral direction and hole 41M prevents inferior conduction between the chip condenser 27 and the conductive plate 21 due to bubbles.

On the end opposite to a side end in the central portion formed with these three holes is formed an upright element 42 having an upright portion 42a (FIG. 2D) bent approximately at right angle to this side of the paper or on the surface where a chip condenser is located. The said upright element 42a is projected in the direction opposite to the projecting direction of the lead wires 28 to 30.

This upright element 42 is formed to be projected through a distance L from a side end 21a of the conductive plate 21. The width W is slightly smaller in dimension than the inside diameter of the cylindrical case 2a of the pusher 2. If the distance L is made to the amount of value in consideration of a wear over a period of time of the rubber material 2b in contact therewith, there occurs no trouble during use. While the upright portion (hereinafter referred to an end-bended element) 42a of the upright element 42 (see FIG. 2D) is shown approximately at right angle to the plane including the lead wires 28 to 30, it is noted that this configuration is not limited thereto but other angles can be used.

In addition, the upright element 42 serves to protect the end of the chip condenser 27 placed closer thereto, as shown in FIG. 2D, and increase the mechanical strength of the conductive plate itself.

Confronted with the inductor place portions 31L and 31R formed on both the wing portions 21L and 21R of the conductive plate 21 are inductor place portions 32L and 32R each having a similar structure. The first intermediate coupling elements 22 and 24 are arranged next to the inductor place portions 32L and 32R.

The first intermediate coupling elements 22 and 24 are formed approximately in the central portion thereof with a holding element 43 for holding lead wires 28 and 30 whose connecting end is formed flatly. This holding element 43 holds a connecting end of a lead wire inserted between the coupling members 22a and 24a and the holding element 43 by the resilient force of the holding element 43. This holding element and the coupling members constitute a lead-wire coupling portion.

In a similar manner, in the central portion of the conductive plate 21 is correspondingly arranged a second intermediate coupling element 23 in a spaced relation.

This second intermediate coupling element 23 is formed with a chip condenser place portion 44 at one end thereof confronting with the conductive plate 21 and the aforementioned lead wire coupling portion 33 at the other end.

The chip condenser place portion 44 is formed with upright elements 44L and 44R approximately in coincidence with the width (at right angle to a long axis) of the chip condenser 27, and formed in the central portion with a hole having a rectangular shape. This hole 45 is formed so that as shown in FIG. 1, when the chip condenser 27 is placed, it is positioned in the vicinity of one end (lower end as shown) of the long axis thereof. The hole 45 prevents the displacement of the chip condenser 27 caused by the cream solder and prevents the chip condenser from being peeled due to flexure in the conductive plate.

Upright elements 34, 35L, 35R and 36 are provided as schematically mentioned on the opposed ends of the first intermediate coupling elements 22, 24 and the second intermediate coupling element 23.

These upright elements 34, 35L, 35R and 36 are formed in the vicinity of the connecting ends with respect to the lead wires of the respective intermediate coupling elements, and in the illustrated embodiment, they are bent toward this side of the paper, that is, on the surface side where the chip condenser 27 is placed. (see FIG. 2B.)

Next, the method for manufacturing the aforementioned composite type circuit part will be described with reference to FIGS. 3A to 3D.

Figure 3A:
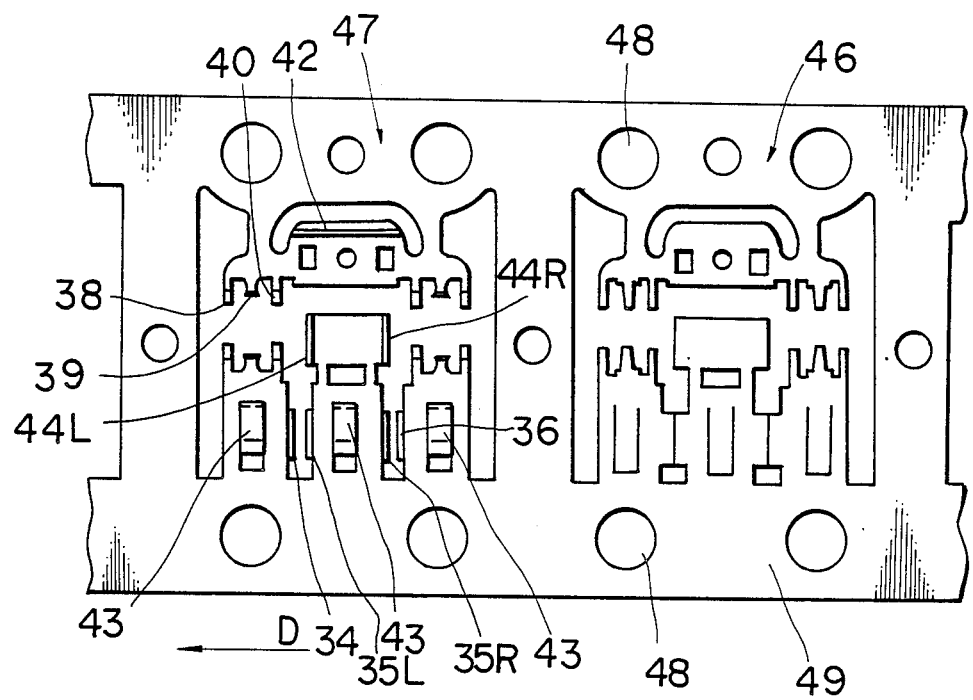
FIG. 3A is a plan view of a lead frame used in the embodiment.

(1) The conductive plate 21, the first intermediate coupling elements 22, 24 and the second intermediate coupling element 23 shown in FIG. 2 are formed at regular intervals by subjecting press working to a metal belt (also called a lead frame) 49 formed of, for example, aluminum alloy, copper and the like as shown in FIG. 3A. More specifically, holes 48 for sprockets are formed at regular intervals in the metal belt, which is intermittently moved in a direction as indicated at arrow D through the holes 48. In the midst of movement, the metal belt is subjected to press working into a configuration including portions constituting the conductive plate, the first intermediate coupling element and the second intermediate coupling element and a portion constituting an upright element, as indicated at arrow 46. At the subsequent predetermined position, the upright elements 42, 44L, 44R, 39, 34, 35L, 35R and 36 and the holding element 43 are formed to be bent.

(2) Inductors are placed on the inductor place portion formed as described above, and cream solder is coated thereof to effect soldering.

(3) After the cream solder has been coated on the position at which the chip condenser is soldered, the chip condenser 27 is placed over the second intermediate coupling element 23 and the conductive plate 21. At this time, the upright element 42 formed on the conductive plate 21 has a function as a positioning member for the chip condenser 27.

(4) The inductors 25, 26, and the chip condenser 27 are placed and connected, then portions constituting the lead frame 49, the conductive plate, the first and second intermediate coupling elements are cut.

Figure 3B:
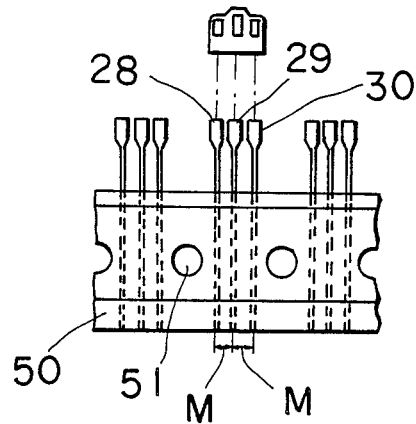
FIGS. 3B to 3D are explanatory views for manufacturing processes.
Figure 3C:
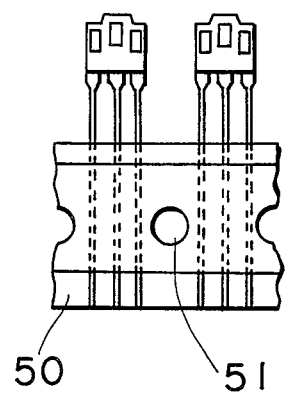
Figure 3D:
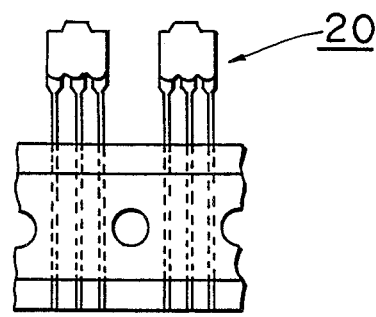

(5) Round lead wires 28 to 30 whose one end formed into a flat configuration as shown in FIG. 3B are inserted into the aforesaid lead wire coupling portions 33.

At this time, the connecting ends 28a to 30a of the lead wires are readily connected since they are flat. Furthermore, at this time, since each of the lead wires is temporarily fixed by a lead wire coupling portion, the design or plan in the manufacturing process can be facilitated.

A plurality of round lead wires are maintained at fixed intervals as shown in FIG. 3B and secured to a transporting belt 20 made of paper, for example, and intermittently transported by sprocket holes 51. The aforesaid fixed interval M refers to the spacing corresponding to each of the lead wire coupling portion 33.

(6) The composite type circuit part thus assembled (shown in FIG. 3C) is coated with synthetic resin, for example.

By the above-described processes, the composite type circuit part is completed.

The present invention is not limited to the embodiments shown above, but it can be variously modified within the scope of the subject matter thereof.

In the following, the operation and effect of the present invention will be described.

First, the operation and effect of the first structure will be described with reference to FIGS. 4A and 4B.

Figures 4A, 4B:
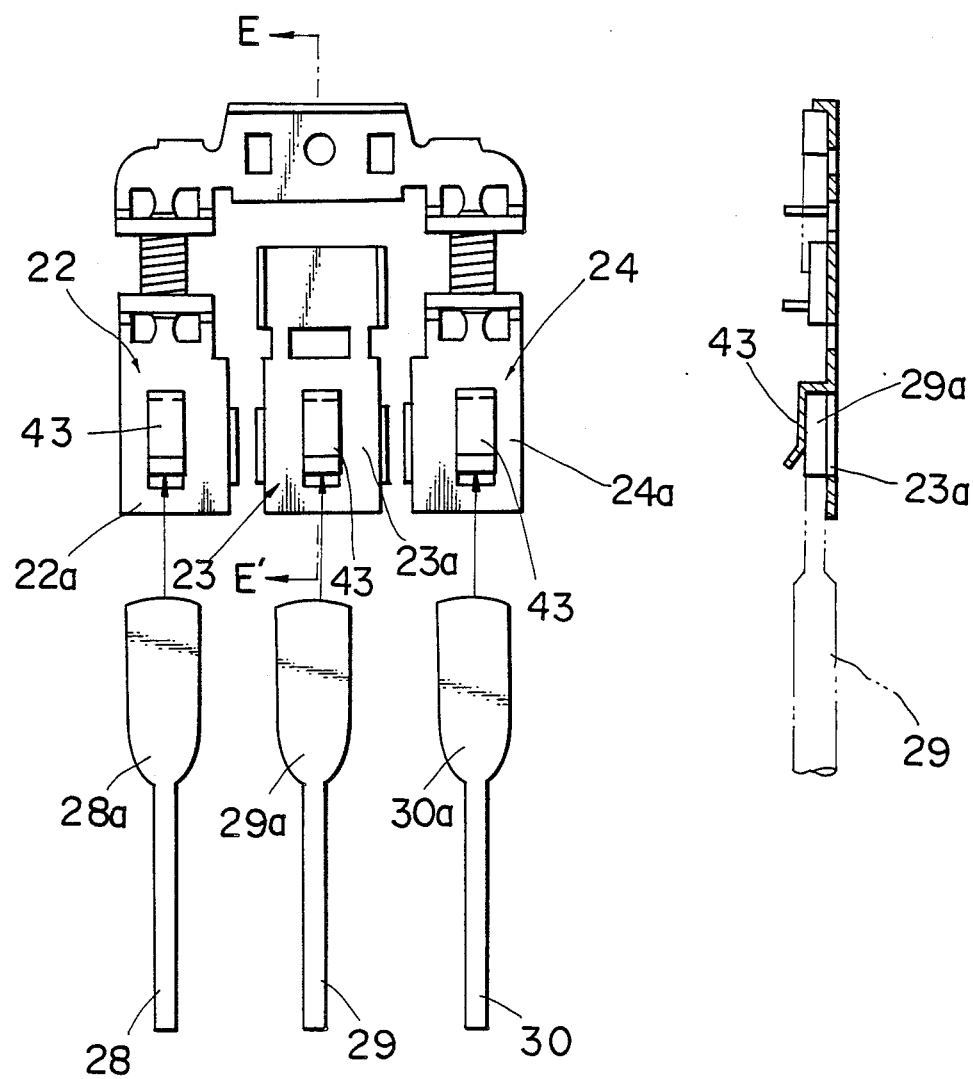
FIGS. 4A and 4B are respectively an explanatory view for connection of lead wires and a sectional view taken on line E—E'.

As shown in FIG. 4A, the first intermediate coupling elements 22, 24 and 23 are formed with holding elements 43 for resiliently holding the connecting ends 28a, 29a and 30a of the round lead wires 28, 29 and 30 inserted between the intermediate coupling members 22a, 24a and 23a, and therefore the lead wire connecting ends 28a, 29a and 30a are merely processed into a flat configuration. Since the lead wire coupling portion 33 is obtained merely by subjecting an intermediate coupling element in the form of a plate to press processing, for example, into a downwardly directed approximately ⊐-shape as shown in FIG. 4B, not only the processing accuracy can be increased but also the processing step can be also simplified. Furthermore, when the lead wire with the connecting end processed into a flat configuration is soldered, the contact area can be increased, and therefore the mechanical strength of the connecting portion can be increased. Moreover, even if there is present unevenness in the quantity of solder to be coated, positive soldering can be performed due to the capillary phenomenon. FIG. 4B shows the state wherein the lead wire 29 is held by the lead wire coupling portion 33.

In the completed composite type circuit part, lead wires are inserted into lead wire receiving holes (not shown) bored in other circuit substrate and connected into conduction by solder. In this case, even if the solder coated on the lead wire connecting ends and the lead wire connecting portion are molten due to the heat of solder, the lead wire connecting ends will not be disengaged from the intermediate coupling elements since in the present invention, the connecting ends of the lead wires are held by the intermediate coupling member and the holding element. Accordingly, a problem encountered in inferior conduction or the like caused thereby can be prevented.

A method for forming a fork holding element in the extreme end of a lead wire can be considered but this is not practical since the end of the lead wire is difficult to be processed. However, according to the present invention, there is an advantage in that a plate-like member is merely stood upright to provide easy formation.

Figure 5A:
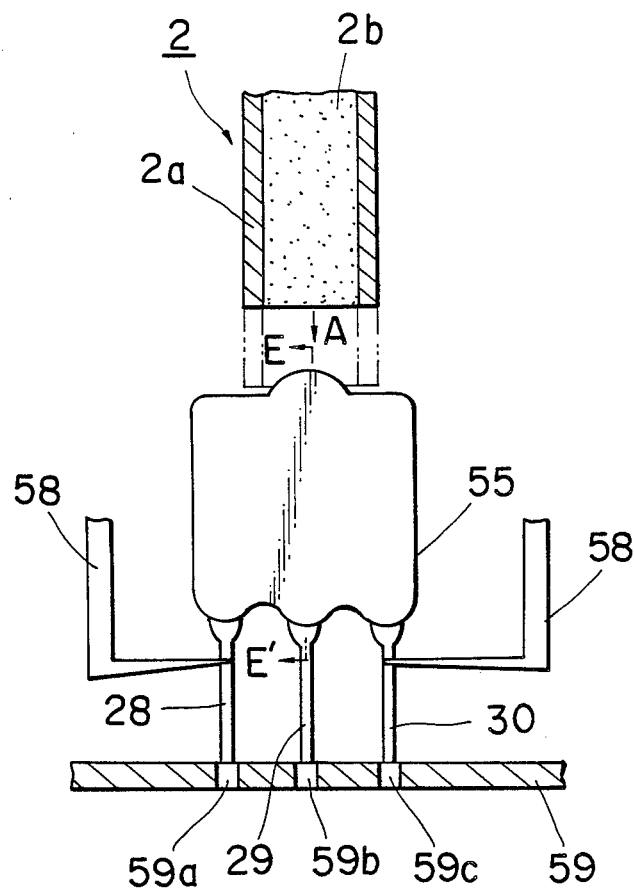
FIGS. 5A and 5B are resepectively a front view explaining that a product is inserted into a substrate and a sectional view taken on line E—E'.
Figure 5B:
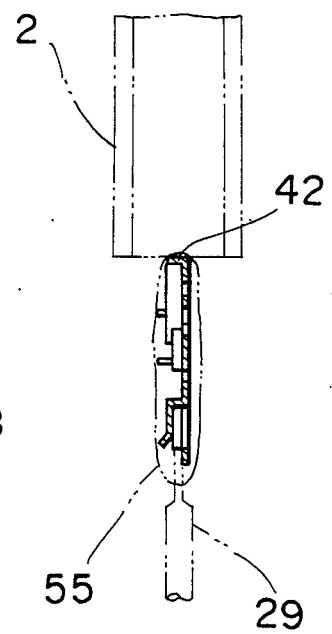

Next, the operation and effect on the basis of the second structure will be described with reference to FIGS. 5A and 5B.

When the composite type circuit part 20 as shown in FIG. 1 is completed, into lead wire receiving holes 59a to 59c set to the automatic inserting machine not shown and bored in the other circuit substrate 59 are inserted corresponding lead wires 28 to 30. Reference numerals 58, 58 denote chucks for holding a lead wire till the lead wires are inserted into the receiving holes 59a to 59c.

In this case, by the provision of an upright element 42 projected from the central portion of the conductive plate 21, the upright element 42 is pressed by the rubber material 2b of the pusher 2. Accordingly, when the composite type circuit part is placed on the other circuit substrate 59, the placement and insertion can be made in the state wherein the cylindrical case 2a is not in contact with the mold material 55. This can prevent a scratch, a crack, a peeling or the like of the surface of the mold material 15 by the presence of the cylindrical case 2a of the pusher 2 involved in prior art. Also, since the mechanical strength can be increased by formation of the upright element 42, it is possible to solve the problems such as inferior electric connection, breakage or the like due to the peeling of condensers caused by flexure of the conductive plate. Even if the upright element 42 portion is pressed by the pusher 2, the force is not applied to the chip condenser directly by the end bended element 42a. Furthermore, an area of the opposed end of the end bended element 42a and the chip condenser is increased to enhance the soldering strength, while an increase in mechanical strength due to the thick adhesion of coating to the upright element 42 can be also obtained.

Subsequently, the operation and effect of the composite type circuit part composed of the third structure will be described.

Since the upright elements 34 to 36 are confronted with each other as previously mentioned, the mold material positioned between the confronted upright elements in the aforementioned dip mold process can be retained due to the capillary phenomenon or the action of surface tension thereof. Accordingly, the state wherein the mold material ceases to exist between the intermediate coupling elements can be avoided, and therefore the mechanical strength of the lead wire connecting portions of the composite circuit part can be enhanced and the strength of the part itself can be also enhanced. From this fact, when the composite type circuit part is placed on the other circuit substrate, the breakage or excessive residual stress to the conductive plate portion will not occur. The position, size, number and the like of the upright elements 34 to 36 can be suitably set according to the viscosity of a coating material, distance of gaps or clearances or the like, and such a matter is not limited to the illustrated embodiment.

Figure 6A:
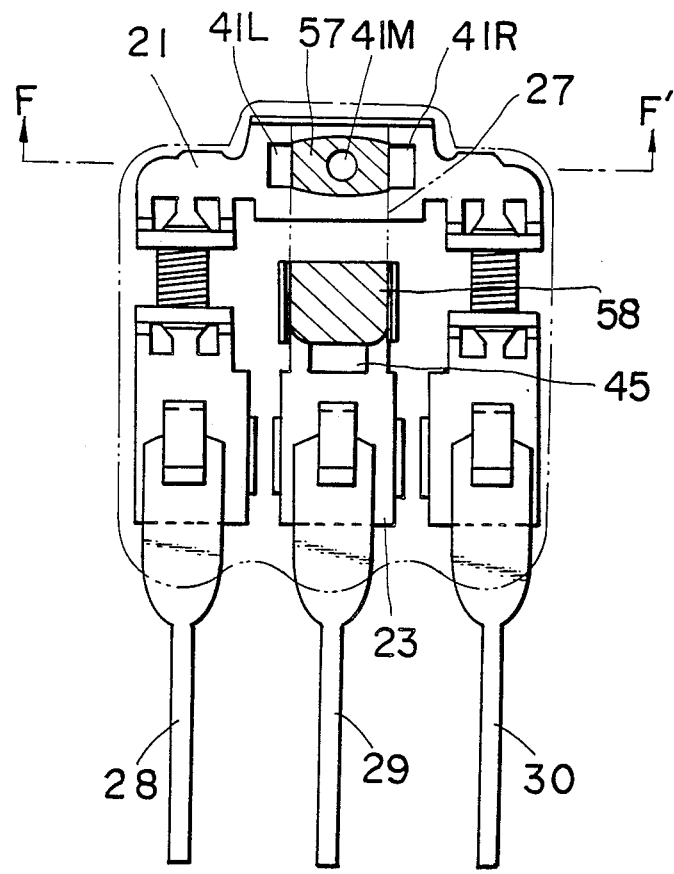
FIGS. 6A and 6B are respectively a plan view for explaining the state of solder-connecting the chip condenser and a sectional view taken on line F—F'.
Figure 6B:
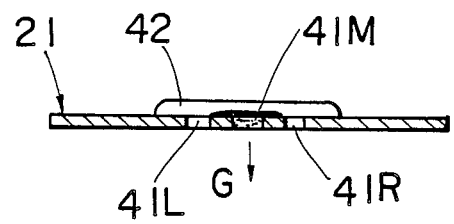
Figure 7A:
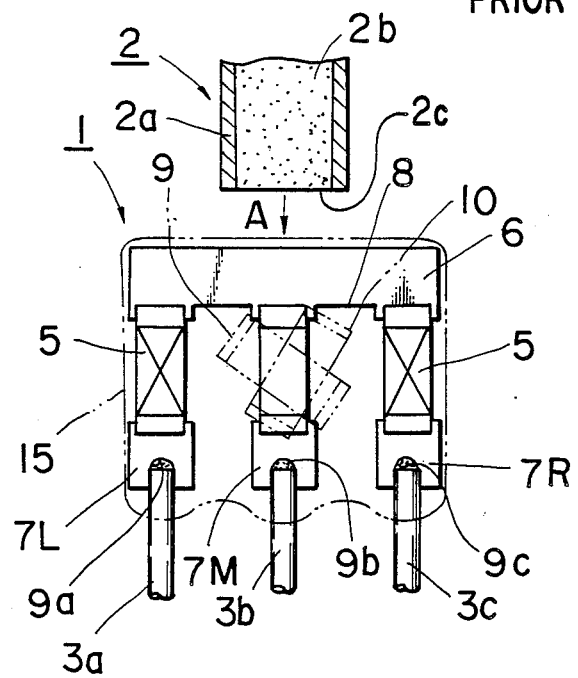
FIGS. 7A and 7B are respectively a schematic front view and a schematic side view of a circuit part shown as prior art and FIG. 7C is an explanatory view for a mold process of a conventional apparatus.
Figure 7B:
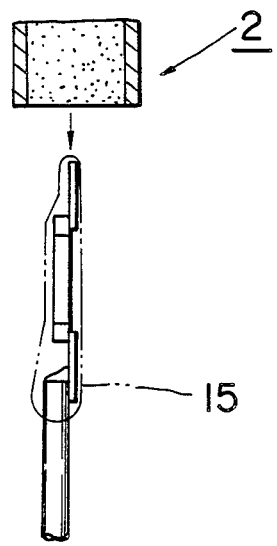
Figure 7C:
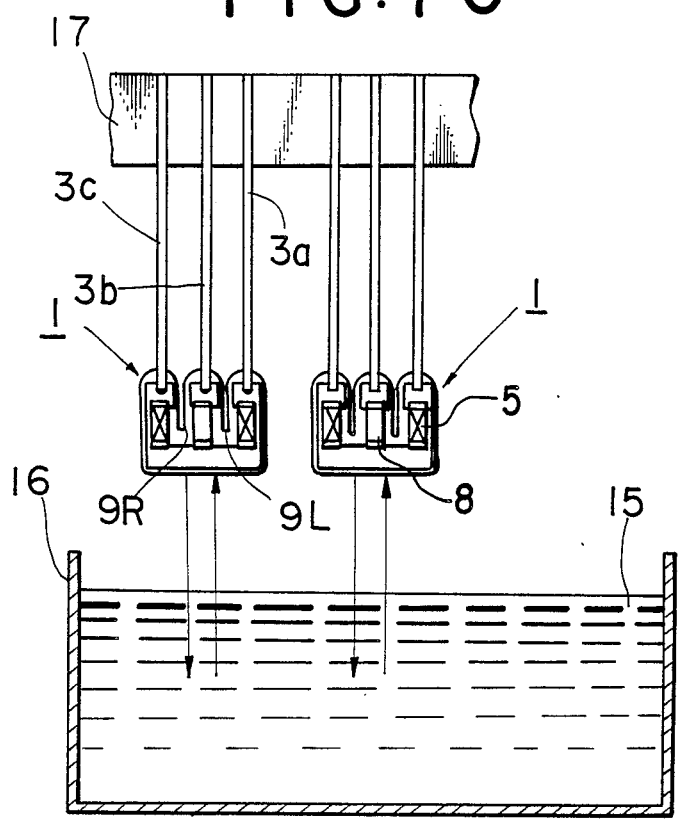

Next, the operation and effect of the circuit part according to the fourth structure will be described with reference to FIGS. 6A and 6B.

The holes 41L and 41R formed in the conductive plate 21 as previously mentioned have a function to prevent the cream solder 57 (as indicated by oblique lines) coated thereon from being diffused in the lateral direction in the figure. Accordingly, it is possible to prevent the chip condenser (as indicated by dash-dotted contour lines) placed between the holes 41L and 41R from being displaced in the lateral direction in the figure.

The hole 41M positioned in the intermediary between the holes 41L and 41R has a function to prevent inferior conduction between the chip condenser 27 and conductive plate 21 due to bubbles generated in the cream solder portion present between the chip condenser 27 and the conductive plate 21. That is, when the chip condenser 27 is placed, the bubbles contained in the cream solder 57 being coated receives pressure from the chip condenser 27, which is removed in the direction of arrow G in FIG. 6B accordingly to provide a good connection.

Similarly, the hole 45 formed in the second intermediate coupling element 23 has a function similar to that of the holes 41R and 41L and has an effect to prevent a displacement of the chip condenser 27 in the direction of the lead wire connecting end caused by the cream solder 58 being coated. Accordingly, the displacement of the chip condenser in two directions is defined by the holes 41L and 41R and the hole 45, whereby it can be placed and fixed at a predetermined position in a positive manner. The hole 45 has a further function that when the composite type circuit part after completion is placed on the other circuit substrate, the force applied at the time of placement is absorbed by elastic deformation of connecting members 56L and 56R narrowed by formation of the hole 45, whereby the force applied does not reach the connecting portion of the chip condenser 27 to prevent the chip condenser from being peeled.

The upright elements 44L and 44R also have a function to increase a contact area caused by soldering between the chip condenser 27 and the second intermediate coupling element in order that the chip condenser to be placed therebetween may be positively placed in conduction and connected, and also serving as a locating member for the chip condenser 27.

What is claimed is:
1. A composite type circuit part comprising:
    a conductive plate formed with a central portion and two wing portions projecting therefrom, both wing portions having inductor mounting portions, respectively;

a pair of first intermediate coupling elements in which each has an inductor mounting portion formed at one end, each inductor mounting portion located opposed to each inductor mounting portion of said wing portions;

a second intermediate coupling element has one end arranged opposedly of said central portion of said conductive plate and arranged at a position between said pair of first intermediate coupling elements;

a lead wire coupling portion, holding a lead wire, is provided in each of said first intermediate coupling elements at another end and in said second intermediate coupling element at another end, lead wires being coupled to each lead wire coupling portion, respectively, said lead wires being flat at least at ends coupled to said lead wire coupling portions, said lead wire coupling portions including holder pieces resiliently holding the flat ends of said lead wires;

inductors placed between and bridging each of said opposed inductor mounting portions of said first intermediate coupling elements and said wings respectively; and a chip capacitor placed over and between the central portion of the conductive plate and the one end of the second intermediate coupling element.

2. A composite type circuit part according to claim 1, wherein a projected element, extending in a horizontal direction, is formed in the central portion of said conductive plate and an extremity end of said projected element is bent to form an upright portion.

3. A composite type circuit part according to claim 1, wherein a side end of each of said pair of first intermediate coupling elements and said second intermediate coupling element are bent to form upright elements which respectively provided on adjacent opposed ends of each said first intermediate coupling elements and said second intermediate coupling element.

4. A composite type circuit part according to claim 1, wherein a hole, which releases bubbles generated in creamy solder, is arranged at a part of the central portion of said conductive plate where said chip capacitor is mounted.

5. A composite type circuit part according to claim 1, wherein a pair of square shaped holes, which prevent creamy solder from being diffused, are arranged at a position at a part of a boundary where said chip capacitor of said conductive plate is mounted, said pair of square shaped holes being arranged at an interval.

* * * * *